(12) United States Patent
Kim et al.

(10) Patent No.: US 9,165,631 B2
(45) Date of Patent: Oct. 20, 2015

(54) OTP SCHEME WITH MULTIPLE MAGNETIC TUNNEL JUNCTION DEVICES IN A CELL

(75) Inventors: Jung Pill Kim, San Diego, CA (US); Taehyun Kim, San Diego, CA (US); Sungryul Kim, San Diego, CA (US); Kangho Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 210 days.

(21) Appl. No.: 13/613,125

(22) Filed: Sep. 13, 2012

(65) Prior Publication Data

US 2014/0071740 A1    Mar. 13, 2014

(51) Int. Cl.
| | |
|---|---|
| G11C 11/16 | (2006.01) |
| G11C 17/00 | (2006.01) |
| G11C 17/02 | (2006.01) |
| G11C 17/16 | (2006.01) |
| G11C 17/14 | (2006.01) |

(52) U.S. Cl.
CPC .......... *G11C 11/1675* (2013.01); *G11C 11/161* (2013.01); *G11C 11/1673* (2013.01); *G11C 17/02* (2013.01); *G11C 17/146* (2013.01); *G11C 17/165* (2013.01); *G11C 2213/78* (2013.01)

(58) Field of Classification Search
CPC ............. G11C 11/1675; G11C 17/146; G11C 11/161; G11C 17/165; G11C 17/02; G11C 11/1673; G11C 2213/78
USPC ............. 365/158, 171, 173, 225.5, 225.7, 94, 365/96, 97
See application file for complete search history.

(56) References Cited

U.S. PATENT DOCUMENTS

| | | | |
|---|---|---|---|
| 6,324,093 B1 * | 11/2001 | Perner et al. ............... | 365/171 |
| 6,590,797 B1 | 7/2003 | Nachumovsky et al. | |
| 6,961,261 B2 | 11/2005 | Iwata | |
| 7,064,975 B2 | 6/2006 | Iwata | |
| 7,577,020 B2 | 8/2009 | Chung et al. | |
| 7,933,136 B2 | 4/2011 | Carter et al. | |
| 2001/0048608 A1 * | 12/2001 | Numata et al. ............... | 365/158 |
| 2002/0006058 A1 * | 1/2002 | Nakajima et al. ............. | 365/171 |
| 2005/0083734 A1 * | 4/2005 | Iwata ........................... | 365/173 |
| 2006/0072364 A1 * | 4/2006 | Yoshida et al. ............. | 365/225.7 |
| 2007/0195629 A1 | 8/2007 | Park et al. | |
| 2008/0101146 A1 * | 5/2008 | Paak et al. ................... | 365/225.7 |
| 2008/0251884 A1 | 10/2008 | Chung et al. | |
| 2009/0316472 A1 | 12/2009 | Wang et al. | |
| 2010/0220517 A1 * | 9/2010 | Okayama .................... | 365/158 |
| 2011/0249491 A1 | 10/2011 | Abedifard et al. | |
| 2012/0134200 A1 | 5/2012 | Khoueir et al. | |

FOREIGN PATENT DOCUMENTS

WO    2008057257 A2    5/2008

OTHER PUBLICATIONS

International Search Report and Written Opinion—PCT/US2013/059809—ISA/EPO—Oct. 25, 2013.

* cited by examiner

*Primary Examiner* — J. H. Hur
(74) *Attorney, Agent, or Firm* — Chui-kiu Teresa Wong; Paul Holdaway (57) ABSTRACT

A one time programming (OTP) apparatus unit cell includes multiple magnetic tunnel junctions (MTJs) and a shared access transistor coupled between the multiple MTJs and a fixed potential. Each of the multiple MTJs in a unit cell can be coupled to separate programming circuitry and/or separate sense amplifier circuitry so that they can be individually programmed and/or individually sensed. A logical combination from the separate sense amplifiers can be generated as an output of the unit cell.

13 Claims, 10 Drawing Sheets

OTP SCHEME WITH MULTIPLE MAGNETIC TUNNEL JUNCTION DEVICES IN A CELL

TECHNICAL FIELD

The present disclosure generally relates to one time programming devices having magnetic tunnel junction (MTJ) devices. More specifically, the present disclosure relates to multiple MTJ devices in a cell of spin transfer torque magnetic random access memory (STT-MRAM) devices.

BACKGROUND

Unlike conventional random access memory (RAM) chip technologies, in magnetic RAM (MRAM) data is not stored as electric charge, but is instead stored by magnetic polarization of storage elements. The storage elements are formed from two ferromagnetic layers separated by a tunneling layer. One of the two ferromagnetic layers, which is referred to as the fixed layer or pinned layer, has a magnetization that is fixed in a particular direction. The other ferromagnetic magnetic layer, which is referred to as the free layer, has a magnetization direction that can be altered to represent either a "1" when the free layer magnetization is anti-parallel to the fixed layer magnitization or "0" when the free layer magnetization is parallel to the fixed layer magnitization or vice versa. One such device having a fixed layer, a tunneling layer, and a free layer is a magnetic tunnel junction (MTJ). The electrical resistance of an MTJ depends on whether the free layer magnitization and fixed layer magnitization are parallel or anti-parallel with each other. A memory device such as MRAM is built from an array of individually addressable MTJs.

To write data in a conventional MRAM, a write current, which exceeds a critical switching current, is applied through an MTJ. The write current exceeding the critical switching current is sufficient to change the magnetization direction of the free layer. When the write current flows in a first direction, the MTJ can be placed into or remain in a first state, in which its free layer magnetization direction and fixed layer magnetization direction are aligned in a parallel orientation. When the write current flows in a second direction, opposite to the first direction, the MTJ can be placed into or remain in a second state, in which its free layer magnetization and fixed layer magnetization are in an anti-parallel orientation.

To read data in a conventional MRAM, a read current flows through the MTJ via the same current path used to write data in the MTJ. If the magnetizations of the MTJ's free layer and fixed layer are oriented parallel to each other, the MTJ presents a resistance that is different than the resistance the MTJ would present if the magnetizations of the free layer and the fixed layer were in an anti-parallel orientation. In a conventional MRAM, two distinct states are defined by two different resistances of an MTJ in a bitcell of the MRAM. The two different resistances represent a logic "0" and a logic "1" value stored by the MTJ.

Bitcells of a magnetic random access memory are generally arranged in one or more arrays including a pattern of memory elements (e.g., MTJs in case of MRAM). STT-MRAM (Spin-Transfer-Torque Magnetic Random Access Memory) is an emerging nonvolatile memory that has advantages of non-volatility, comparable speed to eDRAM (Embedded Dynamic Random Access Memory), smaller chip size compared to eSRAM (Embedded Static Random Access Memory), unlimited read/write endurance, and low array leakage current.

BRIEF SUMMARY

Aspects of the present disclosure include a one time programmable (OTP) apparatus having an access transistor coupled to a fixed potential, a first magnetic tunnel junction (MTJ) device coupled between the access transistor, and a first bit line in a unit cell of the OTP apparatus. The OTP apparatus also includes a second MTJ device, coupled between the access transistor and a second bit line in the unit cell, and programming circuitry coupled to the first MTJ device and to the second MTJ device. The programming circuitry is configured for selecting between the first MTJ device and the second MTJ device to apply a sufficient voltage to break down a barrier layer associated with the selected MTJ device.

According to another aspect, the present disclosure includes a method for implementing a unit cell of an OTP apparatus. The method includes enabling a first programming driver to apply a voltage across only a first magnetic tunnel junction (MTJ) and an access transistor coupled in series. The method may also include enabling a second programming driver to apply a voltage across only a second MTJ device and the access transistor coupled in series.

A one time programmable (OTP) apparatus according to another aspect of the present disclosure includes an access transistor coupled to a fixed potential, a first programmable element coupled between the access transistor and a first bit line in a unit cell of the OTP apparatus, and a second programmable element device coupled between the access transistor and a second bit line in the unit cell. The OTP apparatus also includes programming circuitry coupled to the first programmable element and to the second programmable element. The programming circuitry is configured for selecting between the first programmable element and the second programmable element to apply a sufficient voltage to break down a barrier layer associated with the selected programmable element.

In yet another aspect, an OTP apparatus includes means for applying a voltage across only a first magnetic tunnel junction (MTJ) and an access transistor coupled in series and means for applying the voltage across only a second MTJ device and the access transistor coupled in series.

According to another aspect, the present disclosure includes a method for forming a one time programmable (OTP) cell. The method includes coupling an access transistor to a fixed potential, and coupling a first magnetic tunnel junction (MTJ) device between the access transistor and a first bit line in a unit cell of the OTP apparatus. The method also includes coupling a second MTJ device coupled between the access transistor and a second bit line in the unit cell, and coupling programming circuitry to the first MTJ device and to the second MTJ device. The programming circuitry is configured for selecting between the first MTJ device and the second MTJ device to apply a sufficient voltage to break down a barrier layer associated with the selected MTJ device.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
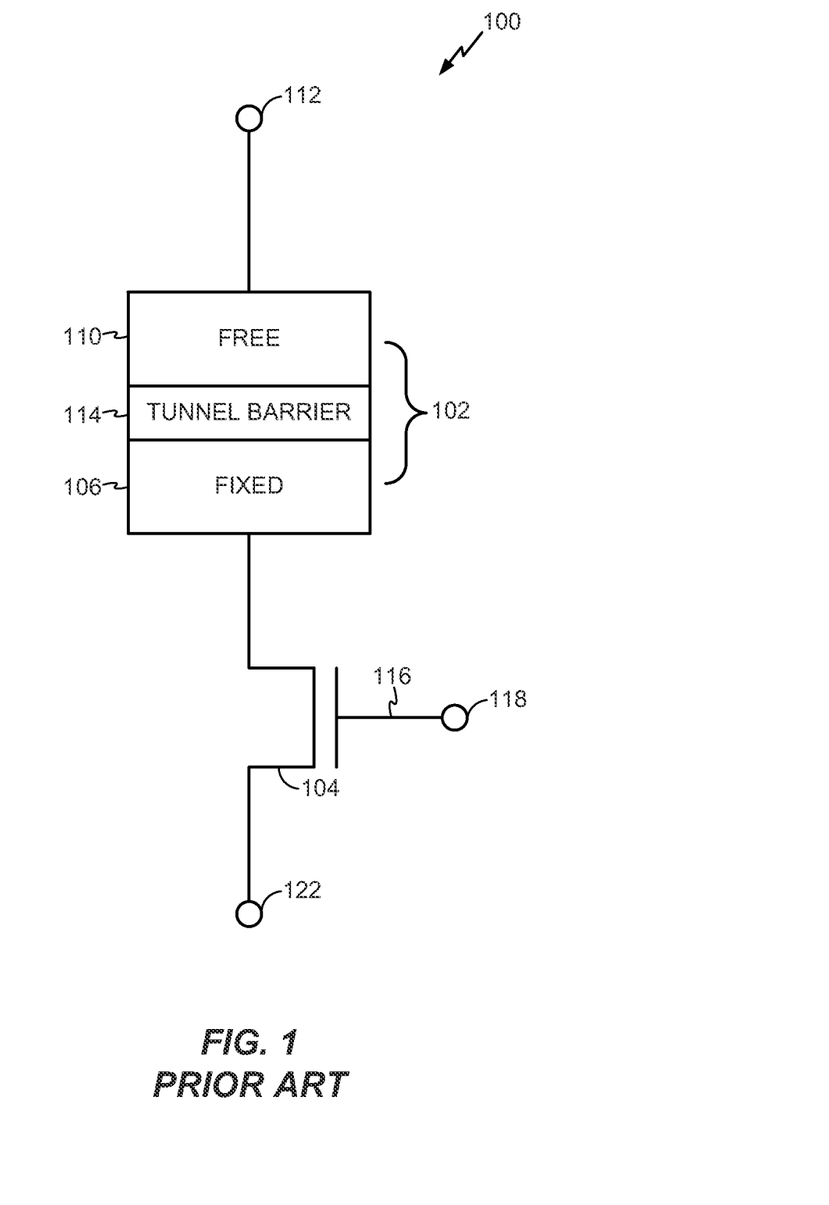
FIG. 1 is a diagram of a magnetic tunnel junction (MTJ) device connected to an access transistor.

FIG. 1 illustrates a one time programmable (OTP) device 100 including a magnetic tunnel junction (MTJ) 102 coupled to an access transistor 104. A free layer 110 of the MTJ 102 is coupled to a bit line 112. The access transistor 104 is coupled between a fixed layer 106 of the MTJ 102 and a fixed potential node 122. A tunnel barrier layer 114, is coupled between the fixed layer 106 and the free layer 110. The access transistor 104 includes a gate 116 coupled to a word line 118.

The OTP device 100 has a pre-programmed high resistance state and a programmable low resistance state. In the pre-programmed high resistance state, the OTP structure exhibits resistance in the kilo-ohm order of magnitude. In the programmable low resistance state the tunnel barrier layer 114 is broken down during an anti-fuse programming so that the OTP structure exhibits resistance in the hundred ohm order of magnitude. The OTP device 100 is programmable by applying a sufficiently high voltage across the MTJ 102 to break down the tunnel barrier layer 114. For example a program voltage of about 1.8 volts may be applied to break down the tunnel barrier layer.

Synthetic anti-ferromagnetic materials may be used to form the fixed layer 106 and the free layer 110. For example, the fixed layer 106 may comprise multiple material layers including a CoFeB, and Ru layer and a CoFe layer. The free layer 110 may be a anti-ferromagnetic material such as CoFeB, and the tunnel barrier layer 114 may be MgO, for example.

Figure 2:
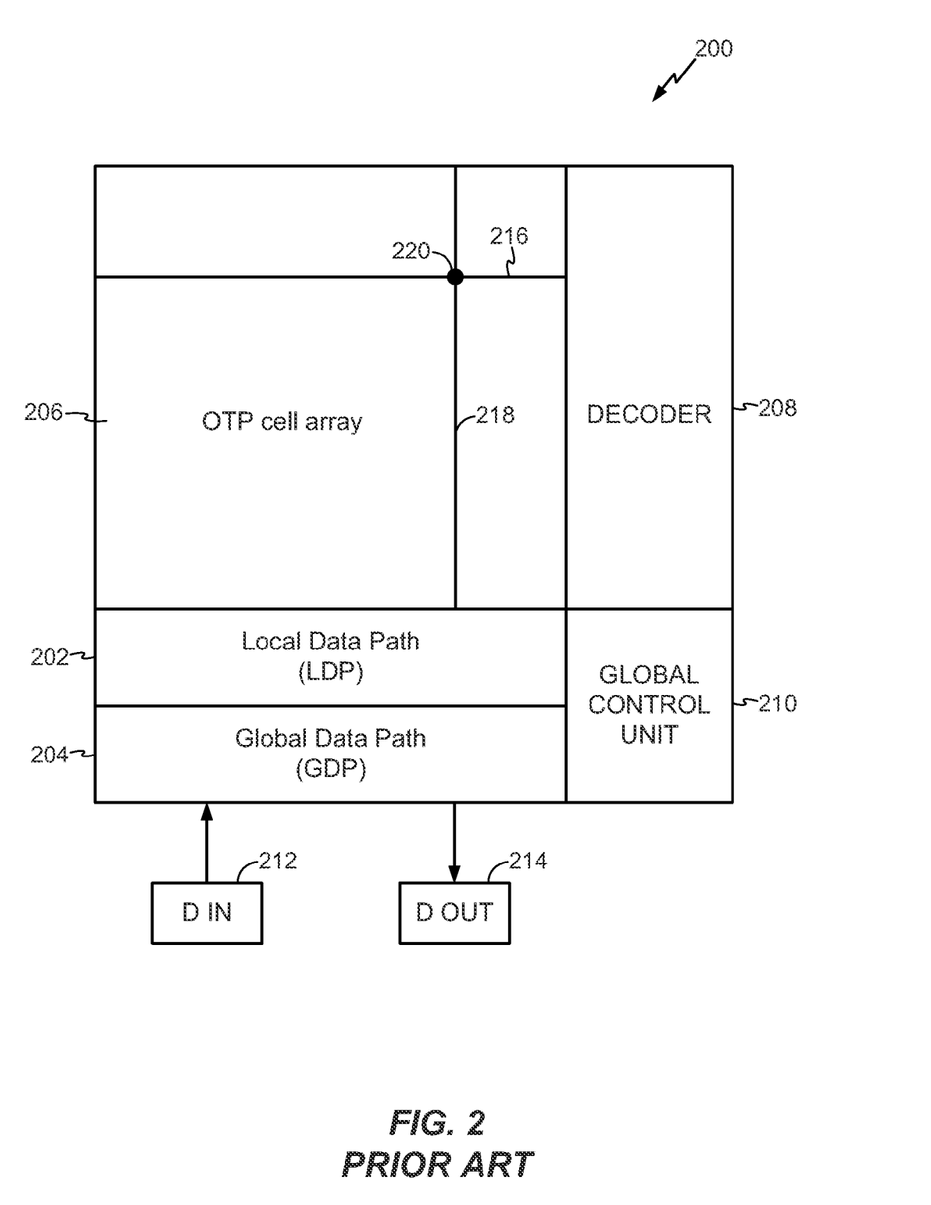
FIG. 2 is a diagram of an one time programming (OTP) device.

FIG. 2 illustrates an OTP memory macro 200. The macro 200 may include a local data path (LDP) 202, a global data path (GDP) 204, a cell array 206, a decoder 208, and a global control unit 210. The LDP 202 includes one or more sense amplifiers and a programming write driver (not shown). The GDP 204 includes circuitry for input and output signal lines or pins, such as a data in (DIN) 212 and a data out (DOUT) 214. The global data path 204 may also include error correcting code (ECC) circuitry (not shown).

The cell array 206 includes multiple rows corresponding to word lines, for example a word line 216 and multiple columns corresponding to bit lines, for example a bit line 218. In one configuration the cell array 206 has 64 rows of word lines and 256 bit lines. The cell array 206 includes numerous unit cells such as a unit cell 220, coupled to the word line 216 and the bit line 218. Each unit cell includes an OTP device 100 as described with reference to FIG. 1.

Figure 3:
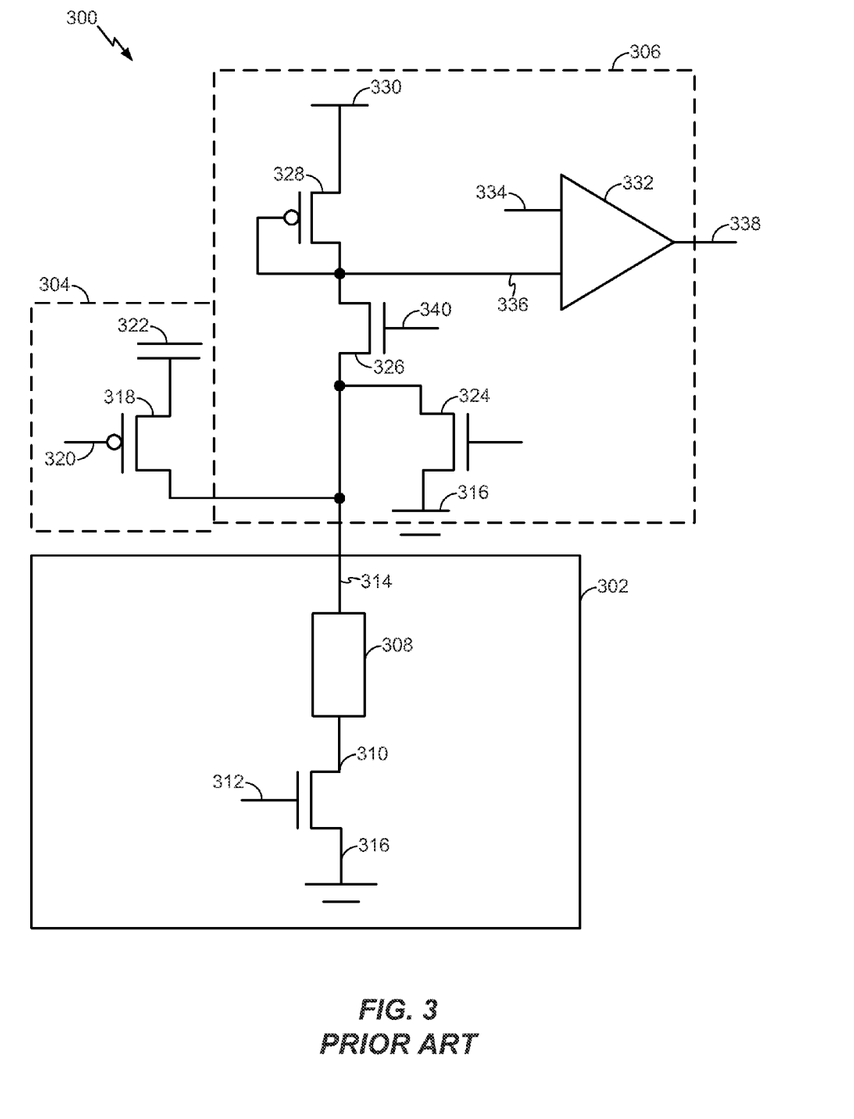
FIG. 3 is a diagram of an MTJ device and circuitry for programming and reading the MTJ device.

FIG. 3 illustrates programming and sensing circuitry 300 for programming a unit cell including an OTP device 302. The programming and sensing circuitry 300 includes programming driver circuitry 304 and sensing circuitry 306. The OTP device 302 includes an MTJ 308 coupled to a bit line 314 and an access transistor 310 coupled between the MTJ 308 and a fixed potential node 316. A word line 312 is coupled to the access transistor 310. The programming driver circuitry 304 includes a programming transistor 318 coupled between a first source node 322 and the bit line 314 and a programming enable node 320 coupled to the programming transistor 318.

The sensing circuitry 306 includes a read sense amplifier transistor 328 coupled between a second source node 330 and a sense input node 336 of a sense amplifier 332. The second source node 330 may be the same node or the same potential as the first source node 322 or may be coupled to a different potential than the first source node 322. The sense amplifier 332 also includes a reference node 334 and an output node 338. A read enable transistor 326 is coupled between the sense input node 336 and the bit line 314. A read enable node 340 is coupled to the read enable transistor 326. A precharge transistor 324 is coupled between the bit line 314 and the fixed potential 316.

During a programming operation of the unit cell 302, a programming enable signal is applied to the programming enable node 320, which allows sufficient voltage across the MTJ 308 to breakdown the tunnel barrier layer of the MTJ.

During a read operation of the unit cell 302, the programming enable signal 320 of the programming driver 304 is off and thus, does not supply any voltage to the bit line 314. A read enable signal is applied to the read enable node 340 which turns on the read enable transistor 326 and allows a read current to flow through the MTJ 308. The resistance of the MTJ 308 is sensed by the sense amplifier 332 by comparing a voltage on the reference node 334 with voltage on the sense input node 336.

To improve bitcell and die yield, two OTP cells may be programmed together using the same programming signaling. Output from the two OTP cells may coupled to OR circuitry to provide an appropriate output signal if at least one of the two OTP cells is effectively programmed. However, the use of two OTP cells to improve bitcell yield and die yield has the disadvantage of nearly doubling chip size.

According to aspects of the present disclosure, two or more MTJs are coupled to a single access transistor within a single OTP unit cell. Although various aspects of the present disclosure are described with reference to MTJs, it should be understood that the MTJs can be replaced by other programmable elements such as e-fuses or resistive memory elements that use barrier oxide between two nodes, for example. The size of an access transistor in an OTP unit cell is generally much larger than the size of an MTJ in the OTP unit cell. When logical comparison circuitry, such as OR circuitry, is used, two MTJs within one unit cell provide information for that cell. Therefore, improved bitcell and die yield may be achieved by including one or more additional MTJs in the OTP unit cell according to aspects of the present disclosure without increasing the overall OTP array size. According to one aspect of the present disclosure, the OTP array size may increase slightly by optionally including a second local data path (LDP) and/or by including logical comparison circuitry to accommodate additional MTJs and bit lines. However, this increase in array size is much less than the increase that would result from the use of two or more bit cells to improve bitcell and die yield as described above.

Figure 4:
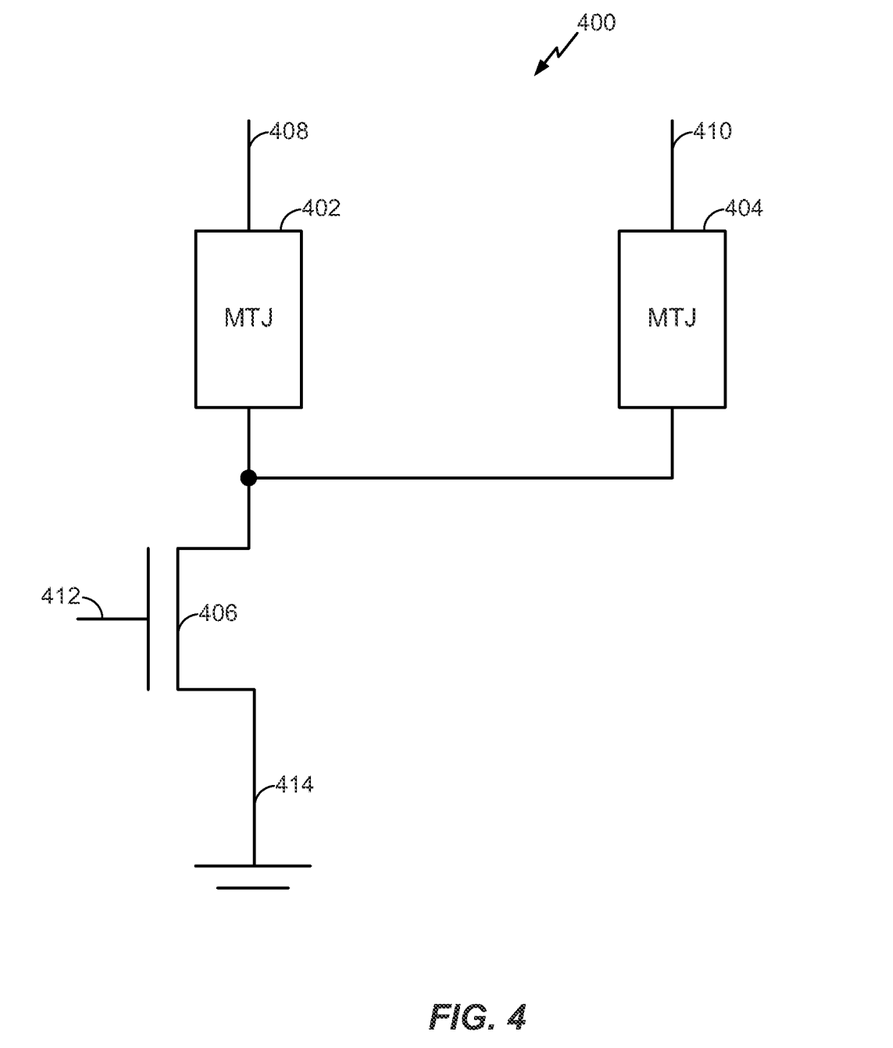
FIG. 4 is a diagram of MTJ devices connected to an access transistor according to aspects of the present disclosure.

FIG. 4 illustrates an OTP unit cell 400 according to aspects of the present disclosure. The OTP unit cell 400 includes an access transistor 406 coupled to a fixed potential 414. A word line 412 is coupled to the access transistor 406. A first MTJ 402 is coupled between the access transistor 406 and a first bit line 408. A second MTJ is coupled between the access transistor 406 and a second bit line 410. According to an aspect of the present disclosure, programming circuitry (not shown) such as the programming driver circuitry 304 shown in FIG. 3, is coupled to the first MTJ 402 and to the second MTJ 404. The programming circuitry is configured for selecting between the first MTJ 402 and the second MTJ 404 to apply a sufficient voltage to break down a barrier layer associated with the selected MTJ.

Figure 5:
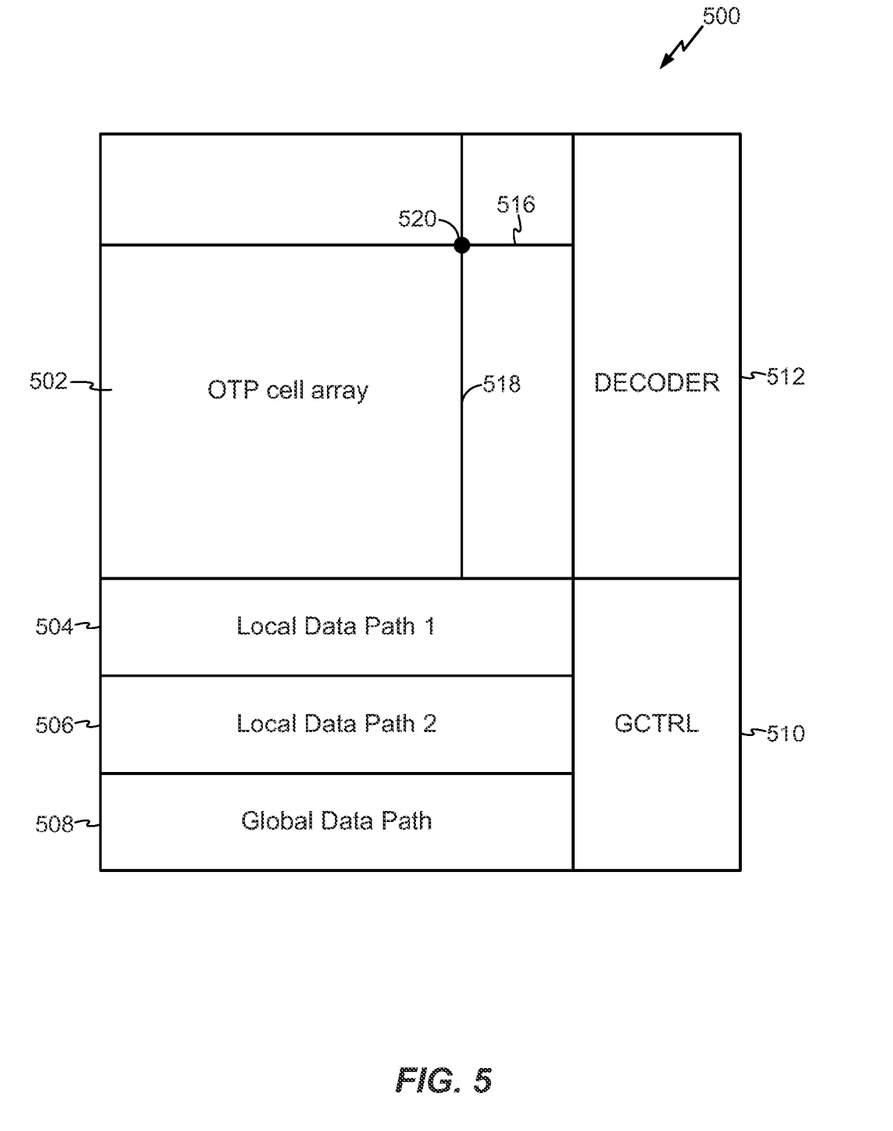
FIG. 5 is a diagram of an OTP device according to aspects of the present disclosure.

FIG. 5 illustrates an OTP array macro 500 according to aspects of the present disclosure. The OTP array macro 500 includes an OTP cell array 502 coupled to a first local data path (LDP) 504, a second LDP 506, a global data path (GDP) 508, global control circuitry 510 and decoder circuitry 512. A cell 520 is coupled to a word line 516 and a bit line 518. The OTP cell array 502 includes numerous OTP unit cells (not shown) such as the OTP unit cell shown in FIG. 4. For example, an OTP unit cell 520, such as the OTP unit cell 400 shown in FIG. 4, is coupled to a word line 516 and a bit line 518 in the OTP cell array 502.

Figure 6:
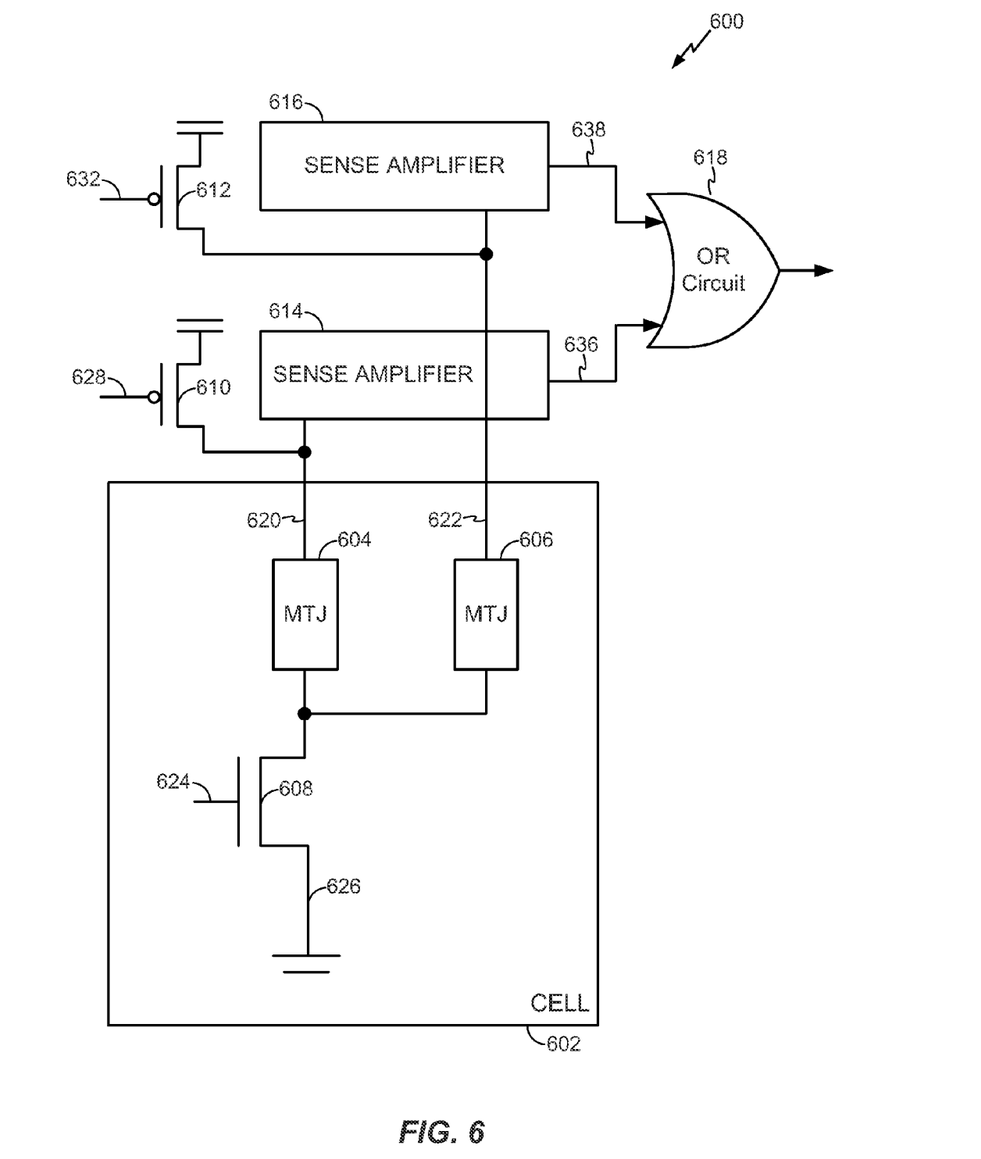
FIG. 6 is a diagram of a cell of an OTP device according to aspects of the present disclosure.

FIG. 6 illustrates programming and sensing circuitry 600 for an OTP cell 602 according to aspects of the present disclosure. The programming and sensing circuitry includes a first sense amplifier 614 coupled to a first MTJ 604 in the OTP cell 602 and a second sense amplifier 616 coupled to a second MTJ 606 in the OTP cell 602. A first programming transistor 610 is also coupled to the first MTJ 604 and a second programming transistor 612 is also coupled to the second MTJ 606. According to one aspect of the present disclosure, an output node 636 of the first sense amplifier 614, and an output node 638 of the second sense amplifier are coupled to logical comparison circuitry, such as OR circuitry, 618 to provide a logical comparison of outputs from the first sense amplifier 614 and the second sense amplifier 616. The OTP unit cell 602 includes an access transistor 608 coupled to a fixed potential 626 and a word line 624. The first MTJ 604 is coupled between the access transistor 608 and a first bit line 620. A second MTJ 606 is coupled between the access transistor 608 and a second bit line 622.

According to one aspect of the disclosure, the first MTJ 604 is programmed by applying an enable signal at a gate 628 of the first programming transistor 610 while applying a non-enable signal to a gate 632 of the second programming transistor 612. This allows sufficient voltage across the first MTJ 604 to breakdown the tunnel barrier layer of the first MTJ 604 without affecting the second MTJ 606. Then the second MTJ 606 is programmed by applying an enable signal to the gate 632 of the second programming transistor 612 while applying a non-enable signal to the gate 628 of the second programming transistor 612. This allows sufficient voltage across the second MTJ 606 to breakdown the tunnel barrier layer of the second MTJ 606 without affecting the first MTJ 604.

According to an aspect of the present disclosure, a read operation is performed by first applying a non-enable signal to the gates 628, 632 of the first programming transistor 610 and the second programming transistor 612. Both the first sense amplifiers 614 and the second sense amplifier 616 are then enabled and provide sensing current to the first MTJ 604 and the second MTJ 606, respectively. The voltage and/or resistance of both the first MTJ 604 and the second MTJ 606 are detected by the first sense amplifier 614 and the second sense amplifier 616, respectively. According to an aspect of the present disclosure, the logical comparison circuitry 618 generates a logical OR combination of the sense amplifier outputs.

In another configuration, only a single sense amplifier is provided. A first switch is coupled between an input of the sense amplifier and the bit lines. A second switch is coupled between the sense amplifier output and the logical comparison circuitry. In operation, the first switch couples the first bit line to the sense amplifier input, and the second switch couples the sense amplifier output to a first input of the logical comparison circuitry. Then, the first switch couples the second bit line to the sense amplifier input, and the second switch couples the sense amplifier output to a second input of the logical comparison circuitry. The logical comparison circuitry can then generate its output based on the two received sense amplifier outputs.

Figure 7:
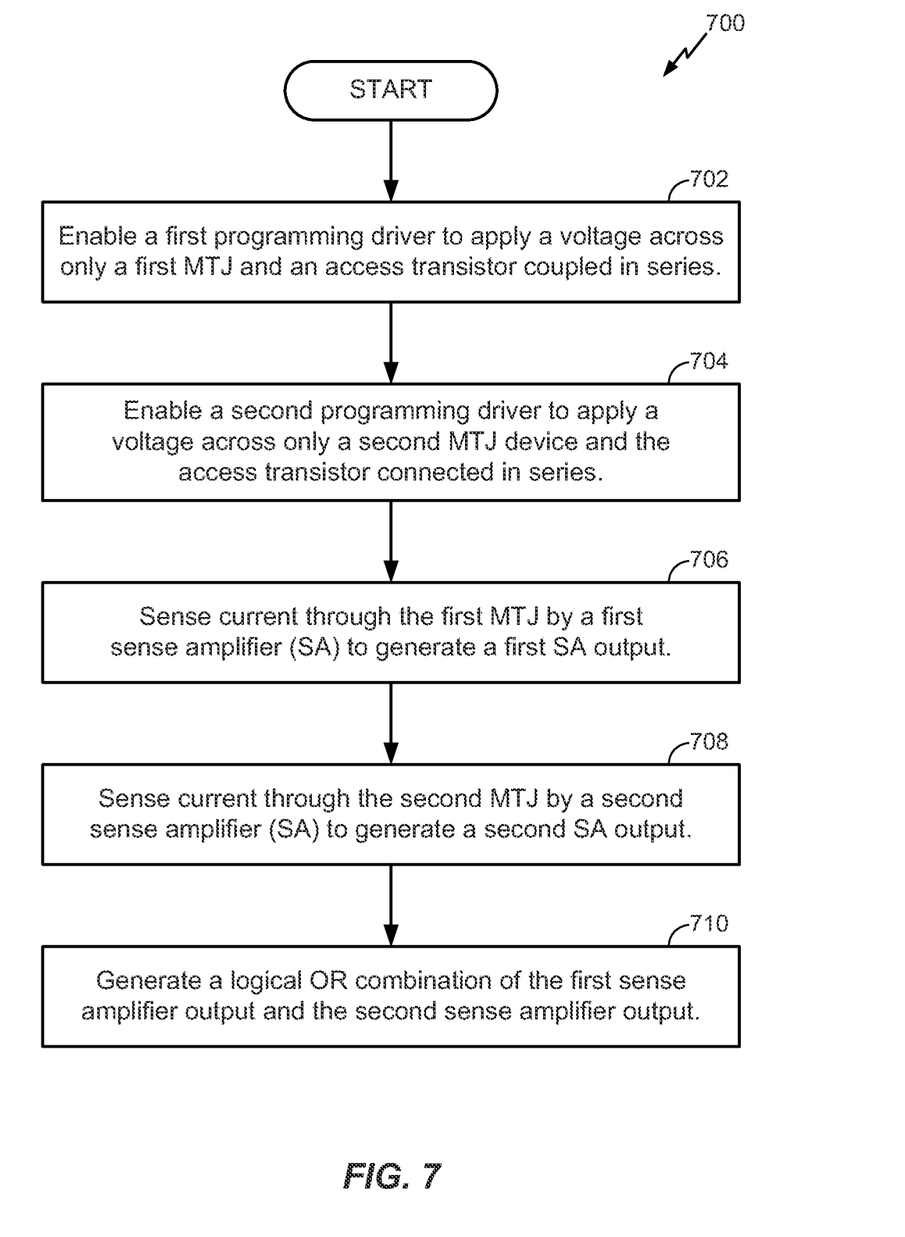
FIG. 7 is process flow diagram illustrating a method of implementing an OTP device according to aspects of the present disclosure.

FIG. 7 is a process flow diagram illustrating a method of operating a unit cell of a one time programming (OTP) device. The method 700 includes, at block 702, enabling a first programming driver to apply a voltage across only a first magnetic tunnel junction (MTJ) and an access transistor coupled in series. The second programming driver is disabled while the first programming driver is enabled. At block 704, the method 700 includes enabling a second programming driver to apply a voltage across only a second MTJ device and the access transistor connected in series. The first programming driver is disabled while the second programming driver is enabled.

At block 706, the method includes sensing current through the first MTJ by a first sense amplifier (SA) to generate a first sense amplifier output. At block 708, the method include sensing current through the second MTJ by a second sense amplifier to generate a second sense amplifier output. At block 710, the method includes generating a logical OR combination of the first sense amplifier output and the second sense amplifier output.

According to an aspect of the present disclosure, a one time programmable (OTP) apparatus includes means for applying a voltage across only a first magnetic tunnel junction (MTJ) and an access transistor coupled in series and means for applying a voltage across only a second MTJ device and the access transistor coupled in series. The means for applying a voltage across the first MTJ and the means for applying a voltage across the second MTJ can be programming circuitry such as the first programming transistor 610 and second programming transistor 612 as shown in FIG. 6, for example.

According to an aspect of the disclosure, the OTP apparatus also includes means for sensing current through the first MTJ to generate a first output, and means for sensing current through the second MTJ to generate a second output. The means for sensing current through the first MTJ can be sense amplifier circuitry such as the first sense amplifier 614 and the means for sensing current through the second MTJ can be sense amplifier circuitry such as the second sense amplifier 616 as shown in FIG. 6, for example.

In another configuration, the aforementioned means may be any module or any apparatus configured to perform the functions recited by the aforementioned means. Although specific means have been set forth, it will be appreciated by those skilled in the art that not all of the disclosed means are required to practice the disclosed configurations. Moreover, certain well known means have not been described, to maintain focus on the disclosure.

Figure 8:
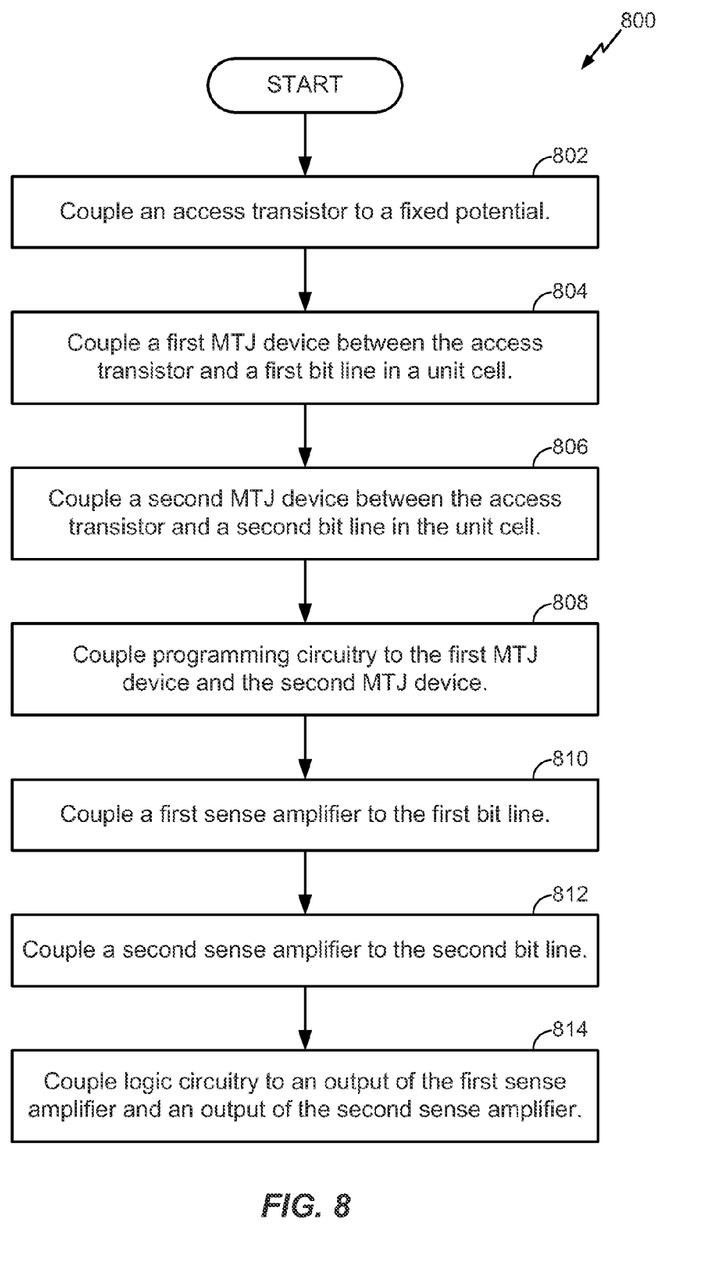
FIG. 8 is process flow diagram illustrating a method of forming an OTP device according to aspects of the present disclosure.

FIG. 8 is a process flow diagram illustrating a method of forming a one time programmable (OTP) cell. The method 800 includes at block 802, coupling an access transistor to a fixed potential. At block 804, the method includes coupling a first magnetic tunnel junction (MTJ) device between the access transistor and a first bit line in a unit cell of the OTP apparatus and, at block 806, coupling a second MTJ device coupled between the access transistor and a second bit line in the unit cell. At block 808, the method includes coupling programming circuitry to the first MTJ device and to the second MTJ device. The programming circuitry is configured for selecting between the first MTJ device and the second MTJ device to apply a sufficient voltage to break down a barrier layer associated with the selected MTJ device.

The method includes, at block 810, coupling a first sense amplifier to a first bit line and, at block 812, coupling a second sense amplifier (SA) to a second bit line. At block 814, the method includes coupling logical comparison circuitry, such as OR circuitry, to an output of the first SA and an output of the second SA. The OR circuitry is configured for outputting a logical OR combination of the output of the first SA and the output of the second SA.

Figure 9:
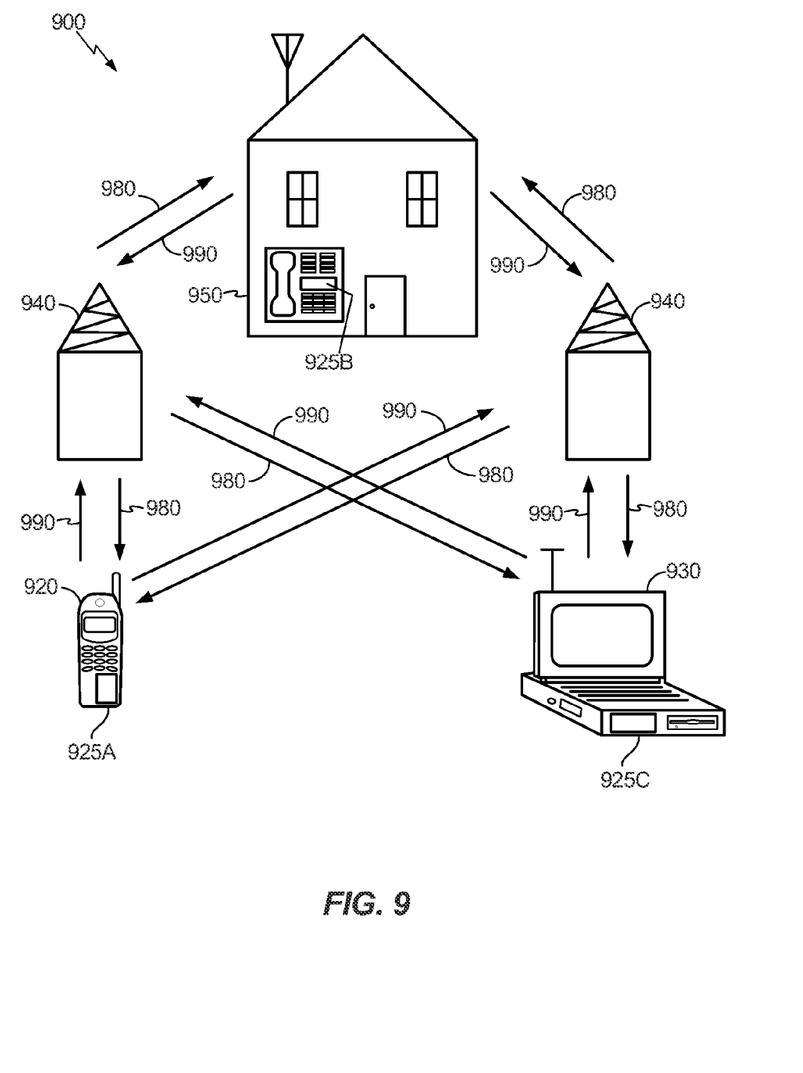
FIG. 9 is a block diagram showing an exemplary wireless communication system in which a configuration of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C and 925B that include the disclosed one time programming (OTP) apparatus. It will be recognized that other devices may also include the disclosed one time programming (OTP) apparatus, such as the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof. Although FIG. 9 illustrates remote units according to the teachings of the disclosure, the disclosure is not limited to these exemplary illustrated units. Aspects of the disclosure may be suitably employed in many devices which include the disclosed one time programming (OTP) apparatus.

Figure 10:
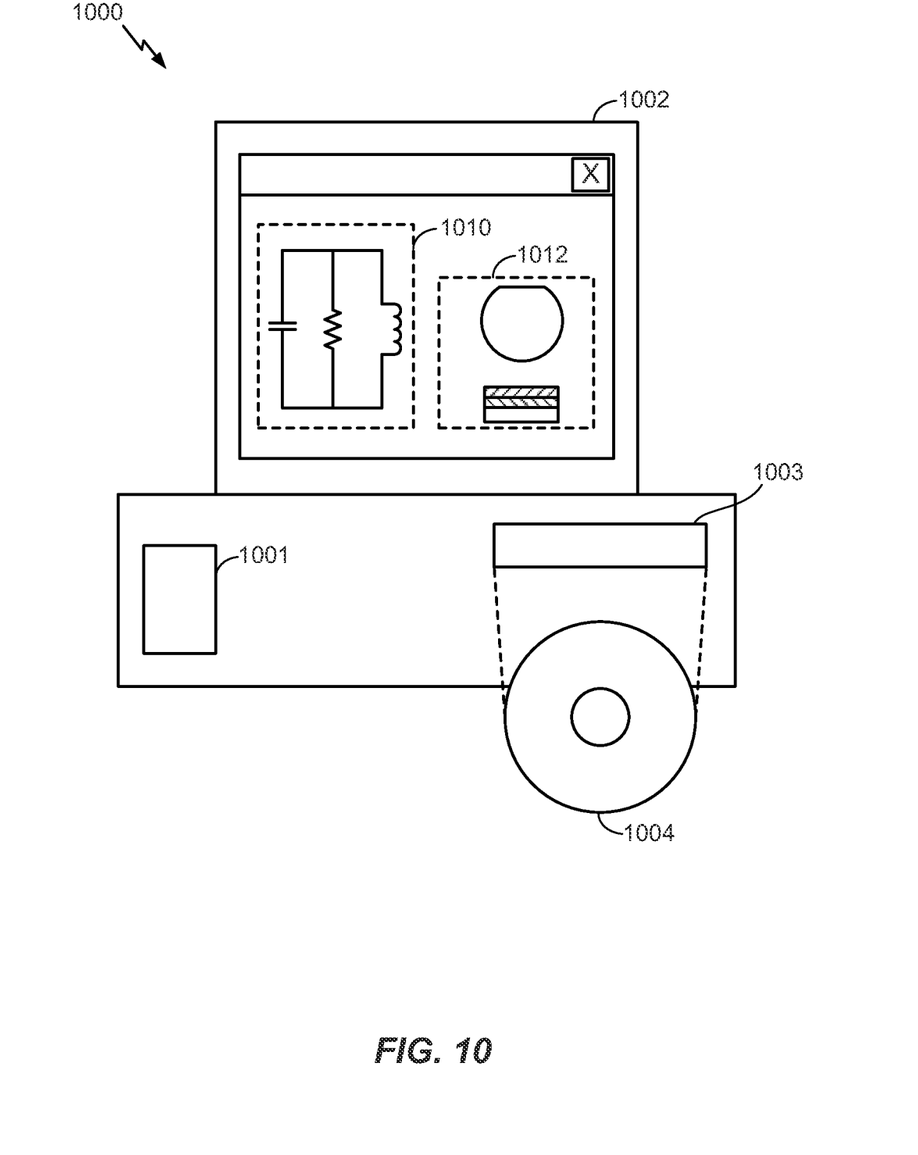
FIG. 10 is a block diagram illustrating a design workstation used for circuit, layout, and logic design of a semiconductor component according to one configuration.

FIG. 10 is a block diagram illustrating a design workstation used for circuit, layout, and logic design of a semiconductor component, such as the one time programming (OTP) apparatus disclosed above. A design workstation 1000 includes a hard disk 1001 containing operating system software, support files, and design software such as Cadence or OrCAD. The design workstation 1000 also includes a display 1002 to facilitate design of a circuit 1010 or a semiconductor component 1012 such as an one time programming (OTP) apparatus. A storage medium 1004 is provided for tangibly storing the circuit design 1010 or the semiconductor component 1012. The circuit design 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit design 1010 or the semiconductor component 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although specific circuitry has been disclosed, such as an OR gate, other logical gates are contemplated.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A one time programmable memory array unit cell, comprising:
    an access transistor having a source node and a drain node, one of the source node and the drain node being coupled to a fixed potential, and to allow for programming and sensing;
    a first magnetic tunnel junction device coupled between the other of the source node and the drain node of the access transistor and a first bit line in the one time programmable memory array unit cell;
    a second magnetic tunnel junction device coupled between the other of the source node and the drain node of the access transistor and a second bit line in the one time programmable memory array unit cell;
    a first sense amplifier coupled to the first bit line;
    a second sense amplifier coupled to the second bit line;
    logical OR gate circuitry comprising a first OR gate input coupled to an output of the first sense amplifier and a second OR gate input coupled to an output of the second sense amplifier; and
    programming circuitry coupled to the first magnetic tunnel junction device and to the second magnetic tunnel junction device, the programming circuitry configured for sequentially coupling the first magnetic tunnel junction device to a first voltage source, decoupling the second magnetic tunnel junction device from the first voltage source and then coupling the second magnetic tunnel junction device to the first voltage source, and decoupling the first magnetic tunnel junction from the first voltage source, wherein the first voltage source is sufficient to break down a first barrier layer associated with the first magnetic tunnel junction device and second barrier layer associated with the second magnetic tunnel junction device, the programming circuitry further configured for decoupling the first voltage source from the first magnetic tunnel junction device and the second magnetic tunnel junction device when either of the first sense amplifier and the second sense amplifier is enabled.

2. The memory array unit cell of claim 1, integrated in a mobile phone, a set top box, a music player, a video player, an entertainment unit, a navigation device, a computer, a handheld personal communication systems unit, a portable data unit, and/or a fixed location data unit.

3. A method for implementing a one time programmable memory array unit cell, comprising:
    enabling a first programming driver to couple a first voltage source node to only a first magnetic tunnel junction and an access transistor coupled in series;
    enabling a second programming driver to couple the first voltage source node to only a second magnetic tunnel junction and the access transistor coupled in series;
    disabling the second programming driver while the first programming driver is enabled;
    disabling the first programming driver and the second programming driver to decouple the first voltage source node from the first magnetic tunnel junction and the second magnetic tunnel junction;
    sensing a first current through the first magnetic tunnel junction by a first sense amplifier to generate a first sense amplifier output while the first voltage source node is decoupled from the first magnetic tunnel junction and the second magnetic tunnel junction;
    sensing a second current through the second magnetic tunnel junction by a second sense amplifier to generate a second sense amplifier output while the first voltage source node is decoupled from the first magnetic tunnel junction and the second magnetic tunnel junction; and
    logically combining the first sense amplifier output and the second sense amplifier output to generate an output of the one time programmable memory array unit cell when either or both of the first sense amplifier output and/or the second sense amplifier output is generated.

4. The method of claim 3, further comprising integrating the one time programmable array unit cell into a mobile phone, a set top box, a music player, a video player, an entertainment unit, a navigation device, a computer, a handheld personal communication systems unit, a portable data unit, and/or a fixed location data unit.

5. A one time programmable memory array unit cell, comprising:
    an access transistor having a source node and a drain node, one of the source node and the drain node being coupled to a fixed potential, and to allow for programming and sensing;
    a first programmable element coupled between the other of the source node and the drain node of the access transistor and a first bit line in the one time programmable memory array unit cell;
    a second programmable element coupled between the other of the source node and the drain node of the access transistor and a second bit line in the one time programmable memory array unit cell;
    a first sense amplifier coupled to the first bit line;
    a second sense amplifier coupled to the second bit line;
    logical OR gate circuitry comprising a first OR gate input coupled to an output of the first sense amplifier and a second OR gate input coupled to an output of the second sense amplifier; and
    programming circuitry coupled to the first programmable element and to the second programmable element, the programming circuitry configured for sequentially coupling the first programmable element to a first voltage source, decoupling the second programmable element from the first voltage source and then coupling the second programmable element to the first voltage source, and decoupling the first programmable element from the first voltage source, wherein the first voltage source is sufficient to break down a first barrier layer associated with the first programmable element and the second barrier layer associated with the second programmable element, the programming circuitry further configured for decoupling the first voltage source from the first programmable element and the second programmable element when either of the first sense amplifier and the second sense amplifier is enabled.

6. The memory array unit cell of claim 5, further comprising logical comparison circuitry coupled to an output of the first sense amplifier and an output of the second sense amplifier.

7. The memory array unit cell of claim 5, in which the first programmable element and/or the second programmable element comprises an e-fuse.

8. The memory array unit cell of claim 5, in which the first programmable element and/or the second programmable element comprises a resistive memory element.

9. The memory array unit cell of claim 5, integrated in a mobile phone, a set top box, a music player, a video player, an entertainment unit, a navigation device, a computer, a hand-held personal communication systems unit, a portable data unit, and/or a fixed location data unit.

10. A one time programmable memory array unit cell, comprising:
  first means for coupling a first voltage source of the unit cell to only a first magnetic tunnel junction and an access transistor of the unit cell coupled directly together in series;
  second means for coupling the first voltage source of the unit cell to only a second magnetic tunnel junction device and the access transistor of the unit cell coupled directly together in series,
  wherein the first means for coupling is disabled when the second means for coupling is enabled, and wherein the second means for coupling is disabled when the first means for coupling is enabled;
  means for decoupling the first voltage source from the first magnetic tunnel junction and the second magnetic tunnel junction;
  first means for sensing current through the first magnetic tunnel junction while the first voltage source is decoupled from the first magnetic tunnel junction and the second magnetic tunnel junction to generate a first output;
  second means for sensing current through the second magnetic tunnel junction while the first voltage source is decoupled from the first magnetic tunnel junction and the second magnetic tunnel junction to generate a second output; and
  means for logically combining the first output and the second output and generating an output of the unit cell when either or both of the first output and/or the second output is generated.

11. The one time programmable memory array unit cell of claim 10, integrated into a mobile phone, a set top box, a music player, a video player, an entertainment unit, a navigation device, a computer, a hand-held personal communication systems unit, a portable data unit, and/or a fixed location data unit.

12. A method for implementing a one time programmable memory array unit cell, comprising steps for:
  enabling a first programming driver to couple a first voltage supply of the unit cell to only a first magnetic tunnel junction and an access transistor coupled directly together in series, while disabling a second programming driver to decoupled the first voltage supply from a second magnetic tunnel junction of the unit cell;
  enabling the second programming driver to couple the first voltage supply of the unit cell to only the second magnetic tunnel junction and the access transistor coupled directly together in series, while disabling the first programming driver to decouple the first voltage supply from the first magnetic tunnel junction;
  disabling the first programming driver and second programming driver to decouple the first voltage supply from the first magnetic tunnel junction and the second magnetic tunnel junction;
  enabling a first sense amplifier to provide a sense current to the first magnetic tunnel junction while the first voltage supply is decoupled from the first magnetic tunnel junction to generate a first sense amplifier output;
  enabling a second sense amplifier to provide a sense current to the second magnetic tunnel junction while the second voltage supply node is decoupled from the second magnetic tunnel junction to generate a second sense amplifier output; and
  generating an output of the one time programmable memory array unit cell when either or both of the first sense amplifier and/or the second sense amplifier is generated.

13. The method of claim 12 further comprising the step of integrating the one time programmable memory array unit cell into a mobile phone, a set top box, a music player, a video player, an entertainment unit, a navigation device, a computer, a hand-held personal communication systems unit, a portable data unit, and/or a fixed location data unit.

* * * * *